US011836425B2

(12) United States Patent
Lee et al.

(10) Patent No.: US 11,836,425 B2
(45) Date of Patent: Dec. 5, 2023

(54) ENGINEERING CHANGE ORDERS WITH CONSIDERATION OF ADVERSELY AFFECTED CONSTRAINTS

(71) Applicant: Synopsys, Inc., Mountain View, CA (US)

(72) Inventors: Hye In Lee, Santa Clara, CA (US); Seungwhun Paik, San Jose, CA (US)

(73) Assignee: Synopsys, Inc., Sunnyvale, CA (US)

( * ) Notice: Subject to any disclaimer, the term of this patent is extended or adjusted under 35 U.S.C. 154(b) by 331 days.

(21) Appl. No.: 17/168,606

(22) Filed: Feb. 5, 2021

(65) Prior Publication Data

US 2021/0256186 A1 Aug. 19, 2021

Related U.S. Application Data

(60) Provisional application No. 62/978,220, filed on Feb. 18, 2020.

(51) Int. Cl.
*G06F 30/327* (2020.01)
*G06F 30/20* (2020.01)

(52) U.S. Cl.
CPC ........... *G06F 30/327* (2020.01); *G06F 30/20* (2020.01)

(58) Field of Classification Search
CPC .... G06F 30/327; G06F 30/20; G06F 30/3312; G06F 30/32
See application file for complete search history.

(56) References Cited

U.S. PATENT DOCUMENTS

| | | | | |
|---|---|---|---|---|
| 7,620,925 B1* | 11/2009 | Manohararajah | ..... | G06F 30/394 716/138 |
| 7,707,530 B2* | 4/2010 | Alpert | ................... | G06F 30/392 716/113 |
| 8,875,082 B1* | 10/2014 | Sircar | ..................... | G06F 30/39 716/132 |
| 9,727,684 B2* | 8/2017 | Dai | ....................... | G06F 30/392 |
| 10,318,676 B2* | 6/2019 | Yeung | .................. | G06F 30/398 |
| 2003/0101399 A1* | 5/2003 | Yoshikawa | ............. | G06F 30/39 714/744 |
| 2006/0026546 A1* | 2/2006 | Dinter | ..................... | G06F 30/00 716/113 |
| 2006/0031798 A1* | 2/2006 | Dirks | ...................... | G06F 30/30 716/139 |
| 2008/0077900 A1* | 3/2008 | Oh | ...................... | G06F 30/3312 716/122 |
| 2013/0074025 A1* | 3/2013 | Fassnacht | ............... | G06F 30/39 716/113 |
| 2019/0080037 A1* | 3/2019 | Ou | ...................... | G06F 30/3312 |
| 2022/0215149 A1* | 7/2022 | Hsu | ........................ | G06F 30/27 |

* cited by examiner

*Primary Examiner* — Nha T Nguyen
(74) *Attorney, Agent, or Firm* — Fenwick & West LLP (57) ABSTRACT

In certain embodiments, a method includes the following steps. An engineering change order (ECO) is for fixing a violation of a target constraint on a target netlist of an integrated circuit. A constraint on a related netlist of the integrated circuit is identified. The identified constraint is adversely affected by fixing the violation of the target constraint. A processor concurrently modifies the target netlist to fix the violation of the target constraint and modifies the related netlist to prevent violation of the adversely affected constraint.

20 Claims, 6 Drawing Sheets

ENGINEERING CHANGE ORDERS WITH CONSIDERATION OF ADVERSELY AFFECTED CONSTRAINTS

RELATED APPLICATION

This application claims the benefit of U.S. Provisional Application No. 62/978,220, "Engineering Change Orders with In-Situ Refinement and Recovery," filed Feb. 18, 2020, which is incorporated by reference in its entirety.

TECHNICAL FIELD

The present disclosure relates to engineering change orders in the design of integrated circuits.

BACKGROUND

Engineering change orders (ECOs) are an important step in the design of integrated circuits. ECOs are additions or changes to an integrated circuit design that occur late in the design process. Most of the integrated circuit may already be completed or nearly completed, meaning that most requirements (constraints) on the design have already been satisfied when an ECO request is made. For example, the ECO may be to fix one of the remaining constraint violations in the design.

However, the ECO step can be complicated and time-consuming since constraints can affect each other. Fixing a violation of one constraint can cause a new violation of another constraint as an unintended consequence. For example, fixing a timing hold violation on one timing path can create timing setup violations on other related timing paths. This is further complicated due to the more complex timing graph structures and larger variations present in advanced nodes.

SUMMARY

In certain embodiments, a method for implementing ECOs includes the following steps. An engineering change order (ECO) is accessed. The ECO is for fixing a violation of a target constraint on a portion of an integrated circuit (the target netlist). A constraint on a related netlist of the integrated circuit is identified. The identified constraint is adversely affected by fixing the violation of the target constraint. A processor concurrently both modifies the target netlist to fix the violation of the target constraint and modifies the related netlist to prevent violation of the adversely affected constraint.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to engineering change orders (ECOs) with consideration of adversely affected constraints. Engineering change orders may involve fixing currently-violated constraints on the design of an integrated circuit. However, fixing one constraint for one part of the integrated circuit design may create a new violation of another constraint for a different but related part of the integrated circuit design.

In one approach, the target constraint is fixed even though it may create new violations elsewhere in the design. These new violations are then fixed in a next ECO step. However, this approach may converge slowly or fail to converge as each fix creates new violations in a possibly never ending cycle. In another approach, the target constraint is fixed, but subject to the requirement that no new violations may be created. In this approach, it may be unnecessarily difficult to fix the target constraint because the ECO solution space is over constrained.

In the approaches described in this disclosure, the target constraint and constraints that may be adversely affected or violated as a result of fixing the target constraint are considered together. Fixing the target constraint on one netlist of the integrated circuit may adversely affect or create violations of other constraints on related netlists of the integrated circuit. Therefore, the target netlist is modified to fix the violation of the target constraint while concurrently modifying the related netlists to prevent violation of the adversely affected constraints on those netlists. This may be referred to as "concurrent" or "in-situ" because the target netlist and the related netlists are considered together, rather than separately, as part of the process of fixing the violation of the target constraint.

This in-situ approach provides a larger solution space for fixing the target constraint, because the related netlists are also allowed to vary while considering possible fixes for the target constraint. This can result in an improved Quality of Result (QoR) for the solution, better convergence and faster runtimes. This, in turn, can reduce memory usage, networking bandwidth, and processor usage.

Figure 1:
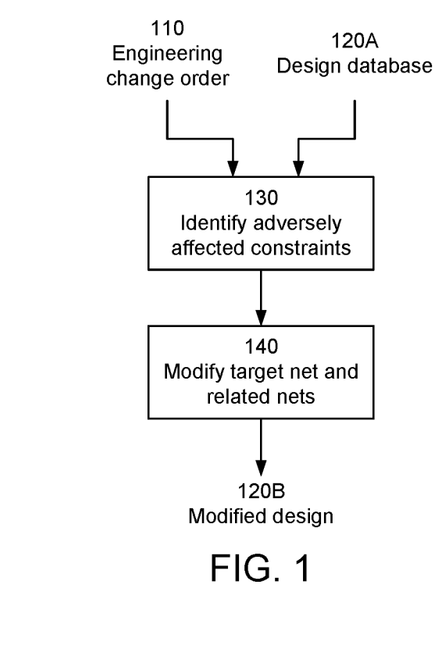
FIG. 1 depicts a flow diagram for carrying out an ECO.

FIG. 1 depicts a flow diagram for carrying out an ECO. The ECO 110 is for fixing a violation of a target constraint on a target netlist of an integrated circuit. A design database 120A contains the current design of the integrated circuit, as well as additional information produced in the design process. For example, the design database 120A may contain a listing of constraints to be met by the design, including relevant metrics for the constraints and whether or not each constraint is met or violated by the current design. Based on the design database 120A, constraints that may be adversely affected by fixing the violation of the target constraint are identified 130. For example, improving the target constraints may make another constraint worse. In some cases, fixing the violation of the target constraint may create new violations of other constraints. The netlists for the adversely affected constraints are related to the target netlist, in the sense that changes to the target netlist affect constraints on these other netlists. The target netlist is modified 140 to fix the violation of the target constraint and the related netlist(s) are also modified 140 to prevent violation of the adversely affected constraints. This results in a modified design 120B. For convenience, the target netlist may also be referred to as the primary or main netlist, and the related netlists may be referred to as secondary or side netlists.

The process shown in FIG. 1 is explained in more detail below using timing examples, but it should be understood that the disclosure is not limited to timing. In these examples, the netlists of interest are timing paths within the integrated circuit. Each timing path has a start point, an end point and combinational logic circuits between the start point and end point. Examples of start points and end points include sequential logic circuits (e.g., a flop or other type of memory), primary inputs, and primary outputs. The constraints are timing constraints, specifically timing setup constraints and timing hold constraints in the examples below. Setup and hold constraints work in opposite directions. Setup constraints ensure that signal propagation through a timing path is not too slow for the circuit to operate properly. Hold constraints ensure that signal propagation is not too fast for the circuit to operate properly. As a result, fixing a setup constraint may introduce a violation of a hold constraint, and vice versa. In the examples below, the related netlists are timing paths that overlap with the target timing path. Thus, if a setup (hold) violation on the target timing path is fixed by modifying the overlapping portion of the path, this may introduce a hold (setup) violation on a side timing path.

Figure 2A:
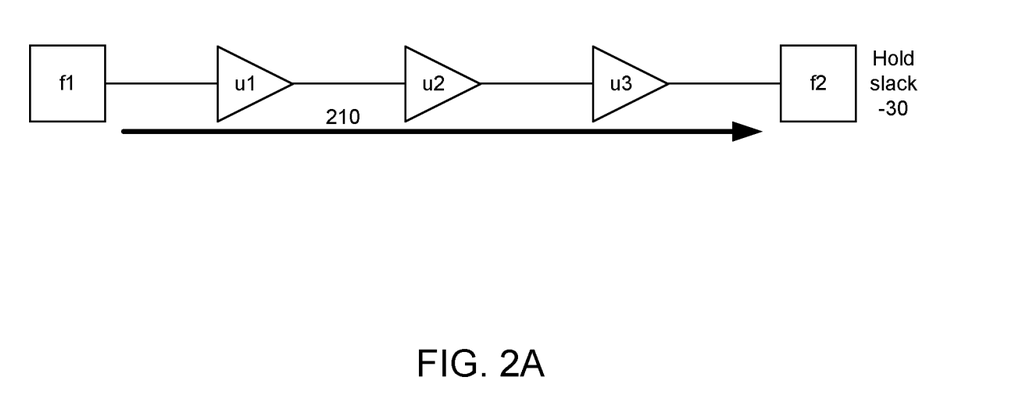
FIGS. 2A-2D are diagrams showing fixing a target timing path without creating violations on side timing paths.

FIGS. 2A-2D are diagrams that show fixing a target timing path without creating violations on side timing paths. FIG. 2A shows the target timing path 210, indicated by the solid arrow. The target timing path 210 has start point f1, end point f2, and combinational logic circuits u1, u2, u3 along the timing path. The design database contains this design information and also includes setup and hold information from previous design runs. In this example, the hold slack=−30. In order to meet a hold constraint, the hold slack must be non-negative. Thus, the target timing path 210 has a hold violation, and the ECO is a request to fix this hold violation.

A hold violation occurs when the signal propagation is too fast compared to the clock speed. Hold violations typically are fixed by adding delay to the timing path, for example by modifying the existing combinational logic circuits u1-u3 or by adding additional buffers or other types of delay along the timing path. Without additional information, adding a delay of 30 to either u1 or to u2 or to u3 would all fix the hold violation. However, these solutions are not equally acceptable, as they may have different secondary effects on other timing paths.

Figure 2B:
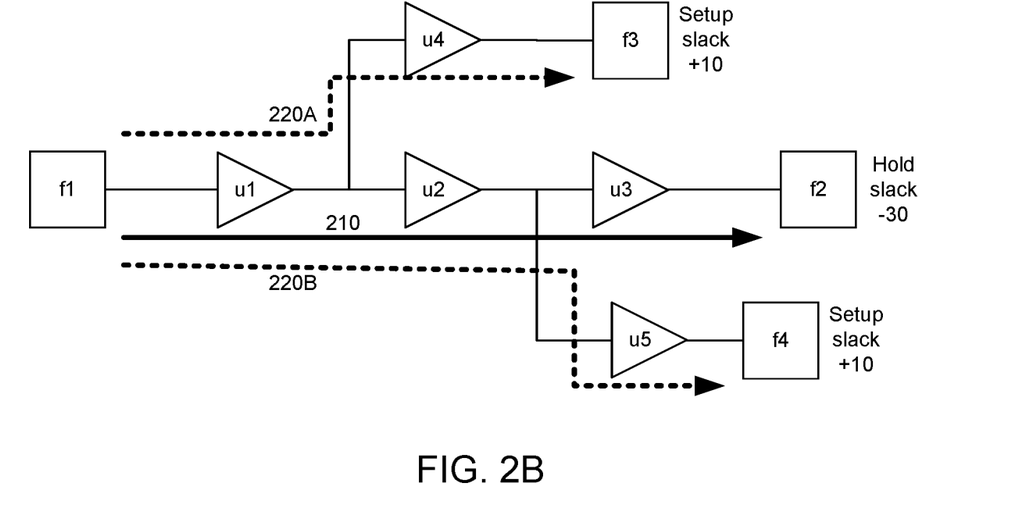

FIG. 2B shows two side timing paths 220A,B indicated by dashed arrows. The side timing paths 220 may be adversely affected by fixing the hold violation on the main path 210. Side path 220A starts from f1, runs through circuits u1 and u4 and ends at f3. Side path 220B starts from f1, runs through circuits u1, u2 and u5 and ends at f4. Both side paths 220 are also subject to hold constraints and setup constraints. The hold constraints are not concerning, because adding delay to the main path 210 will not adversely affect the hold constraints on the two side paths 220. If anything, the hold slack will improve for the side paths.

However, the setup constraints may be adversely affected. In FIG. 2B, side path 220A currently meets its setup constraint with a setup slack=+10. Side path 220B also meets its setup constraint with a setup slack=+10. However, adding delay along these side paths will reduce the setup slack and will create a setup violation if the setup slack is reduced to below zero.

Figure 2C:
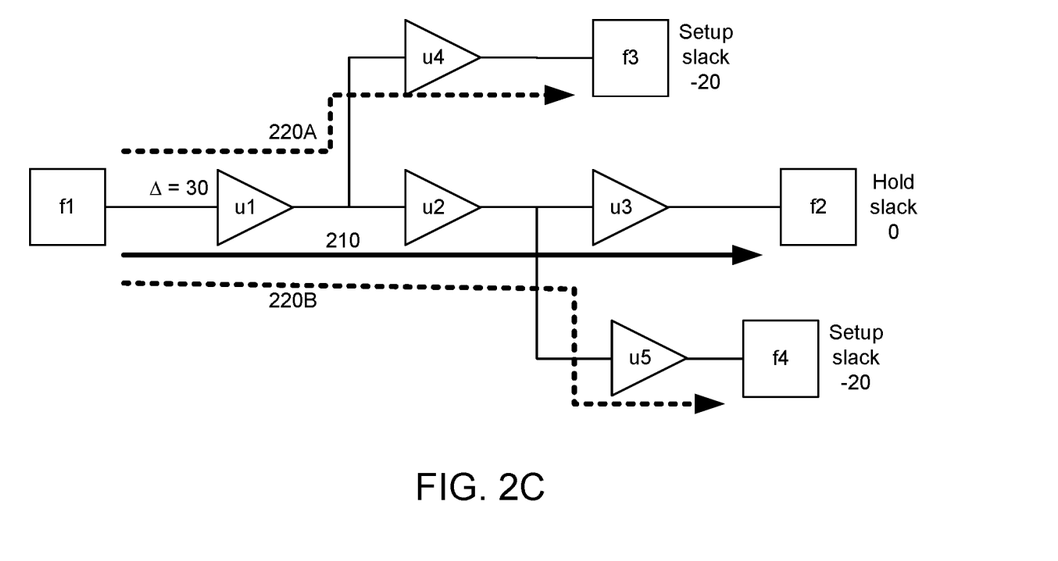

For example, FIG. 2C shows a situation where a delay of Δ=30 is added to circuit u1 (or along the path to circuit u1). This fixes the hold violation, because the hold slack for the main path 210 is now −30+30=0. However, it causes setup violations on both side paths 220A,B, because the additional delay reduces the setup slacks for the side paths to 10−30=−20 for path 220A and to 10−30=−20 for path 220B.

Figure 2D:
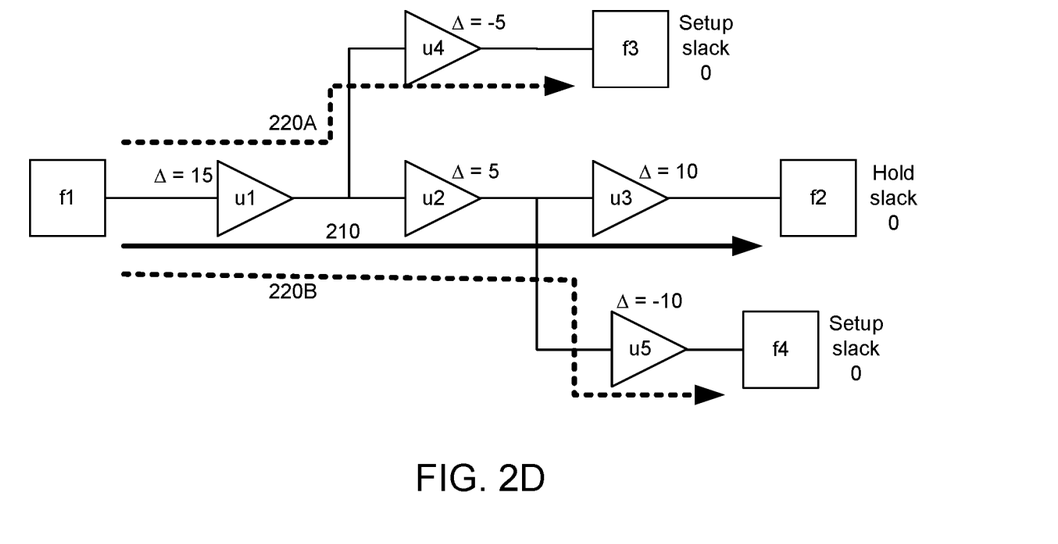

FIG. 2D shows a solution where the setup constraints of the side paths 220 are considered concurrently with the hold violation on the main path 210. In this solution, delays of 15, 5 and 10 are added to circuits u1, u2 and u3, respectively. This improves the hold slack on the main path 210 to −30+15+5+10=0, thus fixing the hold violation. Without other modifications, the side path 220A would have a setup slack of 10−15=−5, which is a setup violation. This is prevented by reducing the delay in circuit u4 (or anywhere along the non-overlapping part of side path 220A) by 5, so that the setup slack is 10−15+5=0. Similarly, without other modifications, the side path 220B would have a setup slack of 10−15−5=−10. This is improved to 0 by reducing the delay along side path 220B by 10.

Figure 3:
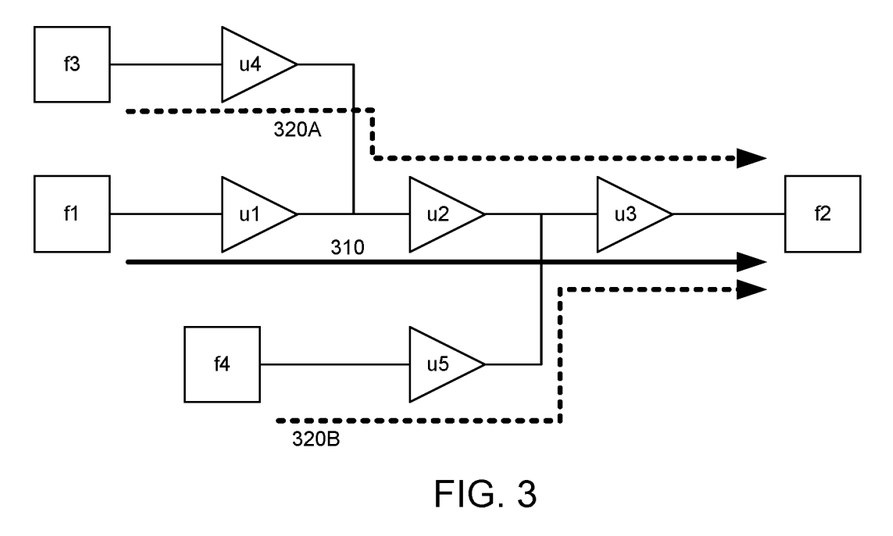
FIG. 3 is a diagram of another target timing path with side timing paths.

In FIG. 2, the main path and side paths all had a common start point f1. FIG. 3 shows a situation in which the main path 310 and two side paths 320A,B all have a common end point f2. The main path 310 is the same as the main path 210 in FIG. 2. The side path 320A has start point f3 and circuit u4, before joining the main path between circuits u1 and u2. The side path 320B has start point f4 and circuit u5, before joining the main path between circuit u2 and u3. In this example, circuits u4 and u5 on the side paths 220 may be modified to allow greater modifications of circuits u2 and u3 on the main path, while still avoiding new violations on the side paths.

Figure 4:
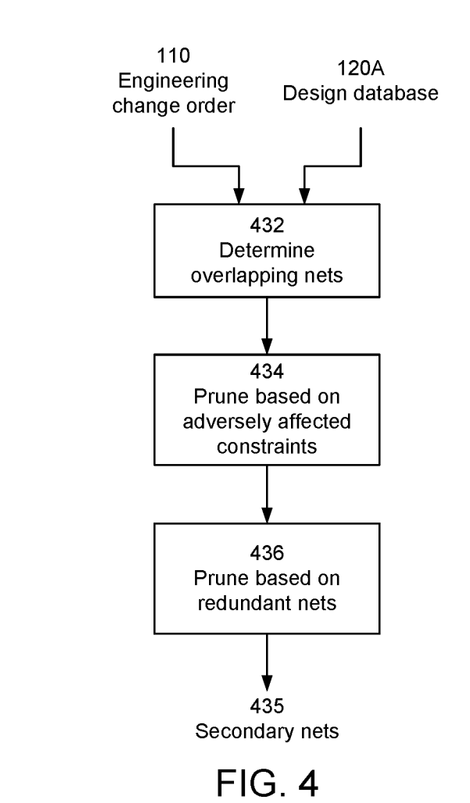
FIG. 4 depicts a flow diagram for identifying side paths.

FIGS. 2 and 3 show side paths that are considered concurrently with the main path. FIG. 4 depicts a flow diagram for identifying the set of side paths and secondary constraints to be considered. These may be substeps within step 130 of FIG. 1. The ECO 110 identifies the target netlist. The design database 120A for the integrated circuit may represent the topology of the integrated circuit as a graph. From this graph representation, a set of netlists that overlap with the target netlist may be determined 432. This may be done using graph traversal techniques. This set may then be pruned 434 to identify those overlapping netlists that have constraints which would be adversely affected by improving the target constraint on the target netlist. In one approach, the pruning 434 may yield only those overlapping netlists that have constraints which would be violated by fixing the target constraint. Even this set may be further pruned 436, for example if certain secondary netlists are redundant with or dominated by other secondary netlists. For example, if preventing violations on secondary netlist A would also always prevent violations on secondary netlist B, then secondary netlist B may be pruned from the set under consideration.

Figure 5:
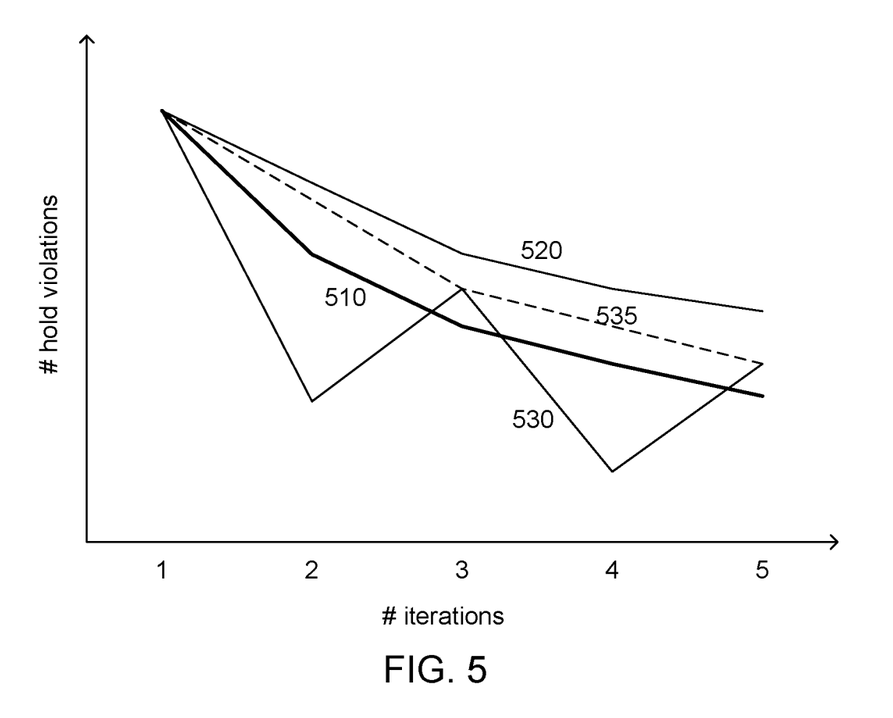
FIG. 5 graphs expected performance of the approach described herein compared to other approaches.

FIG. 5 graphs expected performance for the in-situ approach described above compared to other approaches. The y-axis shows the number of hold violations, and the x-axis shows the number of iterations. Each iteration can be either hold fixing or setup fixing. Graph 510 plots the performance of the in-situ approach described above. Graph 520 plots the performance of an approach where violations on side paths are not allowed. In this approach, fewer violations on main paths are fixable because of this overly restrictive constraint. Graph 520 resolves violations over time, but slower than the in-situ approach of graph 510. Graph 530 plots the performance of an approach where violations on the main path are fixed, regardless of whether that introduces violations on the side paths. Violations on the side paths may then be fixed in the next iteration. However, as shown by graph 530, the number of violations does not decrease monotonically and, in some cases, this approach may not converge. In FIG. 5, the dashed line 535 shows that the overall performance of approach 530 is also slower than the in-situ approach 510.

The description above used timing setup and hold constraints as the target constraint on the target netlist and as the adversely affected constraint on the related netlists. However, the approach is not limited to these constraints. For example, within timing, DRC (design rule check) constraints such as maximum capacitance, maximum transition time, maximum fanout, and noise, may be used. Maximum transition time and maximum capacitance are similar to timing setup, in that these constraints typically will move opposite to a timing hold constraint. Thus, fixing a timing hold violation on a target path may introduce violations of maximum transition time or maximum capacitance on side paths, and vice versa.

The in-situ approach may also be used with non-timing constraints or situations that mix timing constraints with non-timing constraints. Power constraints is one example. Making circuits faster (e.g., fixing setup violations) may increase power consumption, resulting in the violation of power constraints. Conversely, if a circuit is downsized to reduce power consumption, the setup constraint may be adversely affected or even violated if there was not enough setup slack to begin with. Thus, in one approach, the setup slack on other parts of the netlist is increased concurrently with downsizing cells to meet power constraints. This is yet another example where additional flexibility in the timing constraint broadens the solution space for fixing power violations.

As a final example, physical implementation tools must meet constraints on the physical layout of the integrated circuit. For example, constraints in the placement process include the following. There can be no overlap between cells. The placement cannot be too congested for routing—if cells are placed too close to each other, it is hard to route those due to limited routing resource. There are physical spacing rules (e.g., a certain pair of cells cannot be placed next to each other). The placement tool selects the best location for a cell considering all these physical constraints in addition to timing/DRC constraints. However, a placement that is best for physical constraints or that fixes a violation of physical constraints could adversely affect timing/DRC constraints. For example, in FIG. 2B, if for some reason circuit u1 were placed far from f1, then the wire delay between f1 to u1 would increase and this could violate the setup constraint from f1 to f3. The setup violation could be avoided by modifying circuit u4 on side path 220A to increase the setup slack to accommodate the placement of u1.

Figure 6:
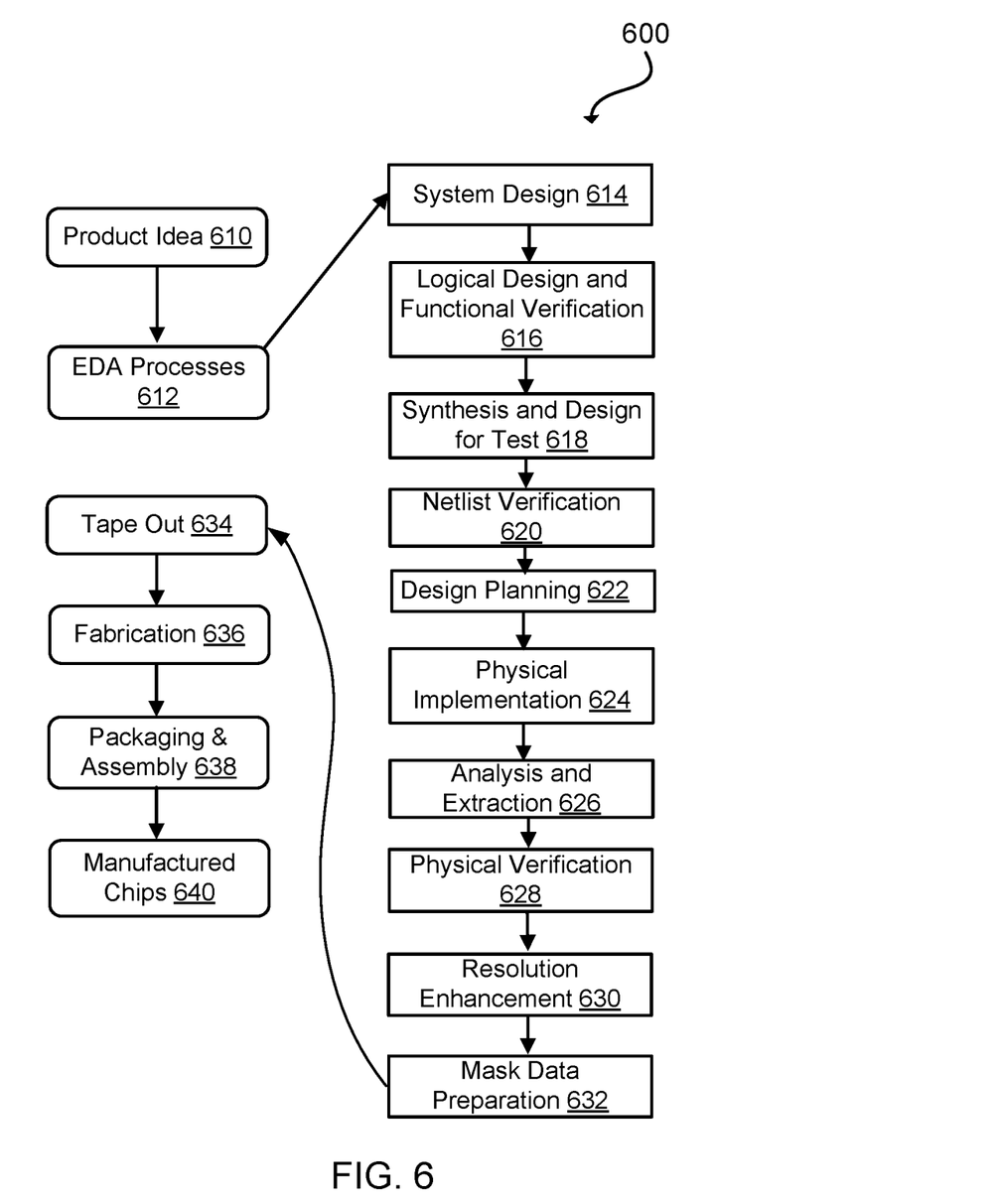
FIG. 6 depicts a flowchart of various processes used during the design and manufacture of an integrated circuit in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 6. The processes described by be enabled by EDA products (or tools).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
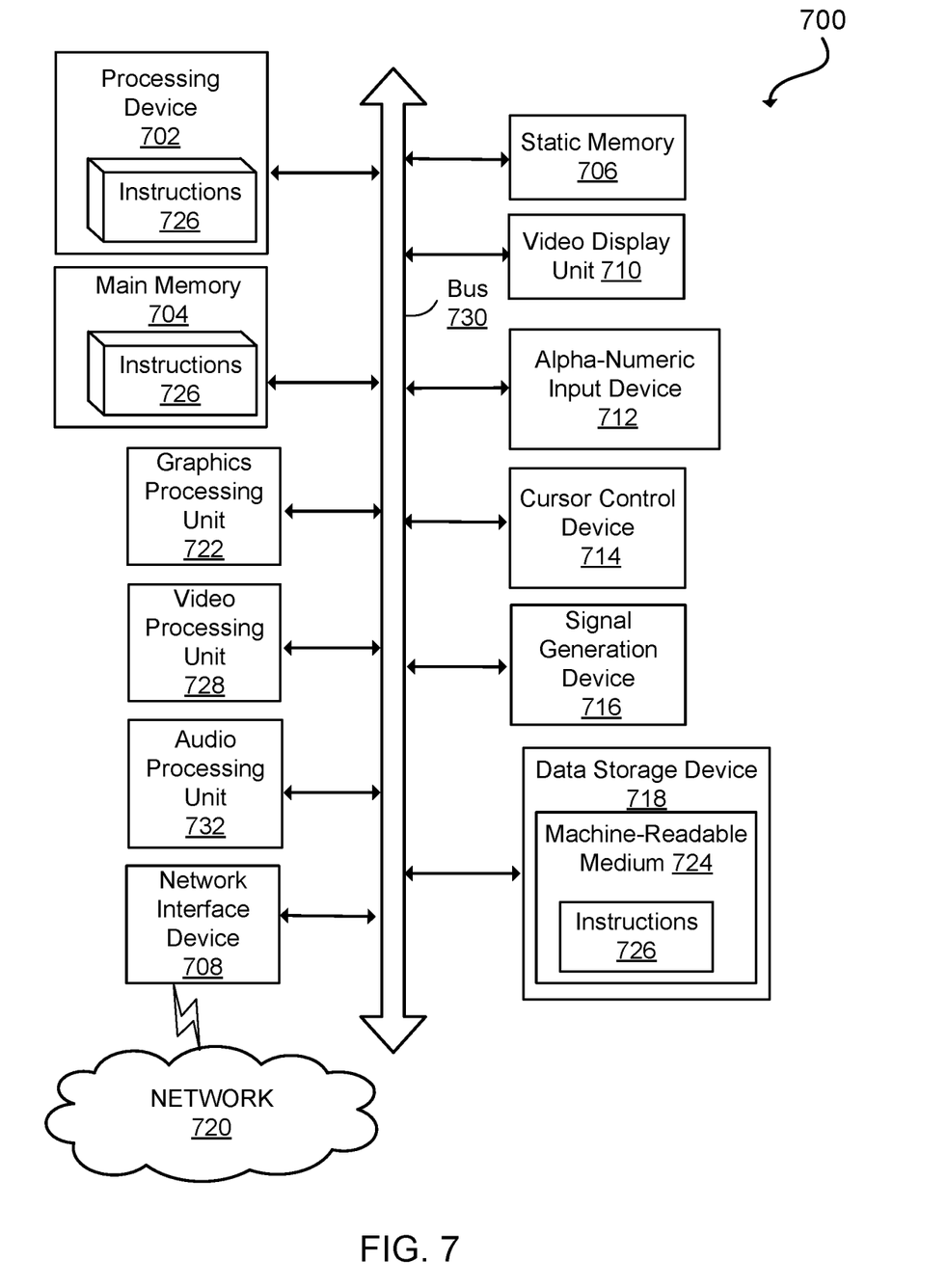
FIG. 7 depicts an abstract diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   accessing an engineering change order (ECO) to fix a violation of a target constraint on a target netlist of an integrated circuit;
   identifying a constraint on a related netlist of the integrated circuit, wherein the constraint is adversely affected by fixing the violation of the target constraint; and
   concurrently, by a processor, modifying the target netlist to fix the violation of the target constraint and modifying the related netlist to prevent violation of the adversely affected constraint.

2. The method of claim 1 wherein the target netlist is a timing path, and the target constraint is a timing constraint on the timing path.

3. The method of claim 2 wherein the related netlist is a timing path that overlaps with the target netlist, and the adversely affected constraint is a timing constraint on the timing path.

4. The method of claim 3 wherein the target netlist and the related netlist share a same start point or a same end point.

5. The method of claim 3 wherein the target constraint is selected from a group of constraints consisting of a timing hold constraint, a timing setup constraint, a maximum capacitance constraint, a maximum transition time constraint, a maximum fanout constraint, and a noise constraint; and the adversely affected constraint is a different constraint selected from the same group of constraints.

6. The method of claim 3 wherein one of the target constraint and the adversely affected constraint is a timing hold constraint, and the other is a timing setup constraint.

7. The method of claim 3 wherein modifying the related netlist comprises modifying a portion of the related netlist that does not overlap with the target netlist.

8. The method of claim 3 wherein the target constraint is a first constraint of either a timing hold constraint or a timing setup constraint, a second constraint is the other of a timing hold constraint or a timing setup constraint, and the method further comprises:
   identifying a set of two or more related netlists of the integrated circuit, wherein fixing the violation of the first constraint on the target netlist would result in a violation of the second constraint on the related netlist; and
   concurrently, by the processor, modifying the target netlist to fix the violation of the first constraint and modifying the set of related netlists to prevent violations of the second constraints.

9. The method of claim 1 wherein identifying the constraint on the related netlist comprises:
   identifying netlists that overlap with the target netlist based on a graph representation of the netlists in the integrated circuit; and
   identifying those overlapping netlists for which fixing the violation of the target constraint would result in a violation of a constraint on the overlapping netlist.

10. The method of claim 1 wherein one of the target constraint and the adversely affected constraint is a timing constraint, and the other is not a timing constraint.

11. The method of claim 10 wherein the other is a power constraint.

12. A system comprising:
   a memory storing instructions; a design of an integrated circuit; and an engineering change order (ECO) to fix a violation of a target constraint on a target netlist of the integrated circuit; and a processor, coupled with the memory and to execute the instructions, the instructions when executed cause the processor to:
  access the ECO;
  identify a plurality of related netlists of the integrated circuit, wherein constraints on the related netlists are adversely affected by fixing the violation of the target constraint;
  identify a set within the plurality of related netlists, for which constraints on the set of related netlists are predicted to be violated by fixing the violation of the target constraint; and
  concurrently, by a processor, modify the target netlist to fix the violation of the target constraint and modify the set of related netlists to prevent violation of the constraints predicted to be violated.

13. The system of claim 12 wherein the target netlist is a timing path, the related netlists are timing paths that overlap with the target netlist, and the target constraint and the constraints predicted to be violated are timing constraints.

14. The system of claim 13 wherein the target constraint is selected from a group of constraints consisting of a timing hold constraint, a timing setup constraint, a maximum capacitance constraint, and a maximum transition time constraint; and the constraints predicted to be violated are different constraints selected from the same group of constraints.

15. A non-transitory computer readable medium comprising stored instructions, which when executed by a processor, cause the processor to:
  access an engineering change order (ECO) to fix a violation of a first timing constraint on a first timing path of an integrated circuit;
  identify a second timing constraint on a second timing path of the integrated circuit, wherein the second timing path overlaps with the first timing path, and the second timing constraint is violated by fixing the violation of the first timing constraint; and
  concurrently with fixing the violation of the first timing constraint, modify the second timing path to prevent violation of the second timing constraint caused by fixing the violation of the first timing constraint.

16. The non-transitory computer readable medium of claim 15 wherein one of the first and second timing constraints is a timing hold constraint, and the other of the first and second timing constraints is a timing setup constraint.

17. The non-transitory computer readable medium of claim 15 wherein modifying the second timing path comprises modifying a portion of the second timing path that does not overlap with the first timing path.

18. The non-transitory computer readable medium of claim 15 wherein the instructions cause the processor further to:
  identify a set of all timing paths that overlap with the first timing path, where fixing the violation of the first timing constraint on the first timing path would result in a violation of the second timing constraint on the overlapping timing path; and
  concurrently, by the processor, modify the first timing path to fix the violation of the first timing constraint and modify the set of overlapping timing paths to prevent violations of the second timing constraints.

19. The non-transitory computer readable medium of claim 18 wherein identifying the set of all timing paths comprises:
  identifying timing paths that overlap with the first timing path based on a graph representation of the integrated circuit; and
  identifying those overlapping timing paths for which fixing the violation of the first timing constraint on the first timing path would result in a violation of the second timing constraint on the overlapping timing path.

20. The non-transitory computer readable medium of claim 15 wherein each of the first and second timing paths comprise a start point, an end point, and combinational logic between the start point and end point; and the start point and end point are each either a sequential logic cell, a primary input, or a primary output.

* * * * *